United States Patent [19]

Daems et al.

[11] Patent Number: 5,045,392

[45] Date of Patent: Sep. 3, 1991

[54] SHEET MATERIAL CARRYING A STRIPPABLE GLOSS-CONTROLLING LAYER

[75] Inventors: Eddie R. Daems; Luc H. Leenders, both of Herentals, Belgium

[73] Assignee: AGFA-Gevaert, N.V., Mortsel, Belgium

[21] Appl. No.: 477,722

[22] Filed: Feb. 9, 1990

Related U.S. Application Data

[62] Division of Ser. No. 284,363, Dec. 14, 1988, Pat. No. 4,925,767.

[30] Foreign Application Priority Data

Jan. 12, 1988 [FR] France .............................. 88200031.8

[51] Int. Cl.$^5$ ....................... B32B 23/04; B32B 23/20; G03C 11/06
[52] U.S. Cl. .................................... 428/341; 428/331; 428/342; 428/478.2; 428/478.4; 428/526; 430/256; 430/257; 430/258
[58] Field of Search .................. 428/478.2, 478.4, 341, 428/342, 532, 340, 526, 331; 430/256, 950, 258, 257

[56] References Cited

U.S. PATENT DOCUMENTS

| 1,989,017 | 1/1935 | Neumann | 430/256 |
| 2,867,542 | 1/1959 | Keyser et al. | 428/478.4 |
| 2,968,582 | 1/1961 | Salminen | 428/478.4 |
| 3,355,322 | 11/1967 | Worrall et al. | 428/478.4 |
| 3,642,474 | 2/1972 | Vereist et al. | 430/257 |
| 4,701,401 | 10/1987 | Leenders et al. | 430/257 |
| 4,710,444 | 12/1987 | Leenders et al. | 430/257 |

FOREIGN PATENT DOCUMENTS

1196843 4/1969 United Kingdom ................ 430/950

Primary Examiner—Thomas J. Herbert
Attorney, Agent, or Firm—William J. Daniel

[57] ABSTRACT

Sheet material including a cellulose acetate temporary support carrying thereon a continuous strippable layer. The strippable layer is a non-photosensitive layer containing a coverage of at most 20 g/m$^2$ gelatin hardened to a degree corresponding to the addition of at least 0.001 g of formaldehyde per g of gelatin. Transfer of the strippable layer from the temporary support onto an image material having e.g. an imaged hydrophilic colloid layer or relief pattern given improved gloss control and optical dot gain control for such image material.

8 Claims, 3 Drawing Sheets

SHEET MATERIAL CARRYING A STRIPPABLE GLOSS-CONTROLLING LAYER

This application is a division of application Ser. No. 284,363, filed Dec. 14, 1988, now U.S. Pat. No. 4,925,767.

DESCRIPTION

The present invention relates to a process and materials for controlling the visible appearance of images present in hydrophilic colloid layer(s) or relief pattern(s).

The visual aspect of images obtained in hydrophilic colloid media such as in a developed and fixed gelatin silver halide emulsion layer is largely affected by background colour and light-reflectance of the support carrying the image layer. Photographs to be inspected in reflection usually have a paper support. The surface structure of the paper and its colour tone largely determine the visual appearance of the image, e.g. its gloss. A glossy appearance adds to the contrast and gives a better rendition of fine detail. Glossy photographic paper as supplied by the manufacturer dries with a shiny surface, which can further be improved by glazing. For example, a wet print can be glazed by squeegeeing it onto a clean polished surface that optionally is heated. Hot-glazing requires the use of gelatin layers that are hardened otherwise they would melt and stick to the glazing plate.

Normally photographic silver halide emulsion materials have an outermost layer acting as a gloss improving anti-abrasion layer. Known anti-abrasion layers are generally layers of gelatin a few microns thick optionally containing a hardening agent for gelatin such as chrom alum or some colloidal inorganic material such as silica as described e.g. by P. Glafkidés in the book Photographic Chemistry, Vol. I, Fountain Press—London (1985) p. 474 and in French Patent specification No. 1,551,591.

The application of a thin anti-abrasion layer acting also as a gloss improving layer, by coating from a liquid composition requires a cumbersome and sophisticated coating equipment which in practice is only available in factories producing photographic materials. In some cases it is advantageous to have the possibility to determine at the stage of image-processing which appearance a print should have. For example, such is the case when a photographic image is formed on a permanent support by a plurality of superposed hydrophilic colloid patterns representing a multi-colour relief image obtained by wash-off processing of hardening-developed coloured hydrophilic colloid layers.

The production of colour relief images representing linework or halftone multicolour colloid patterns is of interest in the field of design, e.g. in the production of colour decorative patterns, colour wiring and circuit diagrams, cartography, colour proofing and the preparation of transparencies for transmission projection or production of images on a reflective base for overhead projection.

Photographically produced colour proofs are a substitute for multicolour halftone reproductions as are produced by successive printing in registration images found by the separate standard inks, magenta, yellow, cyan and black, on a conventional printing press, known as press proofing.

Press proofing for the production of colour proofs by preparing a printing plate and running the plate on the press to produce only a few copies as proof of the quality of the halftone separation transparencies used in the plate production is a very expensive procedure and therefore photographic processes not requiring press proofing have been developed to obtain a similar result by means of which the appearance of a print obtained from particular colour separation negatives or positives can be judged by the printer and client.

Examples of processes for the production of multicolour relief patterns using the transfer of coloured colloid layers from a temporary support onto a permanent support are described e.g. in U.S. Pat. Nos. 3,642,474, 4,701,401 and 4,710,444.

In such processes the multicolour pattern is formed by superposed relief paterns obtained by wash-off processing of image wire exposed layers.

When using said processes for the production of multicolour halftone images serving as a pre-press colour proof it is important that the total dot area of the resultant screened images corresponds as close as possible to the total dot area of the halftone prints obtained in the actual mechanical printing process. The optical dot area (ODA) is a measure of the total dot area that takes into account both physical and optical dot gain. The optical dot area (ODA) is the total amount of light absorbed by the halftone dot pattern printed on a substrate. It is expressed as the percentage of the substrate that would have to be covered with halftone dots to achieve a certain density, provided there was no dot spread or gain and the substrate reflected 100 percent of the light impinged on the surface (ref. the article "Dot Gain: Causes and Cures"—"The Quality Control Scanner" published monthly by Graphic Arts Publishing Co., 3100 Bronson Hill Road, Livonia N.Y. 14487. (1982) Volume 2, Number 9, p. 5).

Dot gain is made up of two components, physical and optical dot gain. Physical dot gain is an actual enlargement of mechanical dot size which occurs during the printing process wherein individual ink dots are spread or expanded on the printing paper.

Optical dot gain results when light penetrates the printing paper in the clear areas, becomes internally scattered therein and partially absorbed in the ink dots making the dots visually appear larger. Optical dot gain can be influenced by changing the paper stock (see the article "Gaining on Dot Gain" by Johan Strashun in Graphic Arts Montly, January 1985, p. 69).

In offset printing the greatest dot gain occurs in the mid tones, i.e. around the 50 percent dot value. Good colour balance is obtained when all colours have equal dot gain.

In published European Patent Application (EP-A) 0 236 783 electrophotographic colour proofs of halftone dot patterns are made which closely simulate the dot gain of prints painted with lithographic plates and inks. The resulting colour proof comprises a toner dot pattern on a reflective support and the toner pattern is covered by stripping and laminating with a thin transparent layer and a thicker transparent layer to give the screen dots in the toner pattern an apparent increase in optical dot area (ODA) which simulates that of the press print.

It is an object of the present invention to provide a process for imparting a desired visual appearance to images present in hydrophilic colloid layer(s) or relief pattern(s).

It is more particularly an object of the present invention to provide a process for controlling such appearance aspects as gloss and/or colour tone of images present in hydrophilic colloid layer(s) or relief pattern(s) on a paper support.

It is likewise an object of the present invention to provide a process for optically increasing the apparent dot size of screen dots of a halftone pattern obtained in hydrophilic colloid layer(s) or relief pattern(s) on a paper support.

It is a further object of the present invention to provide a sheet or weblike material suited for applying by wet lamination and stripping a gloss-controlling layer on top of or underneath an image or images contained in a hydrophilic colloid layer(s) or superposed hydrophilic colloid relief patterns.

Other objects and advantages of the present invention will become clear from the further description.

The process according to the present invention for controlling the visual appearance of an image present on a permanent support in a hydrophilic colloid layer, multi-layer system or relief pattern is characterized by the step of transferring a continuous non-photosensitive layer from a temporary support onto said permanent support before said image is formed thereon and/or on top of said image after said image has been formed on the permanent support, said transfer proceeding by pre-wetting the permanent support which either or not carries already said image, contacting it in pre-wetted state with said continuous layer and stripping off the temporay support to leave said continuous layer on said permanent support, wherein said continuous layer is non-photosensitive and contains hardened gelatin, the gelatin being applied at a coverage of at most 20 g/m$^2$ and the hardening of the gelatin corresponding with a hardening achieved by the addition of at least 0.001 g of formaldehyde per gram of gelatin.

The hardening of the gelatin proceeds preferably by means of a hardening agent added to the coating composition of said continuous layer before applying it to its temporary support. The hardening can utilize any hardening agent suited for hardening gelatin known to those skilled in the art but proceeds preferably with formaldehyde. A survey of hardening agents for gelatin is given e.g. by T. H. James in the book "The Theory of the Photographic Process" 4th. ed. Macmillan Publishing Company Co., Inc. New York (1977) p. 78–84.

According to some embodiments said continuous layer contains also gloss controlling, i.e. gloss improving or gloss reducing, substances other than gelatin.

Gelatin alone in said continuous layer has a strong gloss improving effect but requires for particularly high gloss fairly high gelatin coverage, i.e. fairly thick gelatin layers. Thinner gloss improving layers can be obtained by applying the gelatin in combination with colloidal silica and/or by replacing part of the gelatin by poly-N-vinylpyrrolidone.

Colloidal silica suited for use according to the present invention has preferably an average particle size between 10 and 100 nm. Such silica particles are available in the form of aqueous dispersions marketed under the names LUDOX (registered trade mark of I. E. du Pont de Nemours, Wilmington, Del. U.S.A.), SYTON (registered trade mark of Monsanto Chemical Corporation, Boston, Mass. U.S.A.) and KIESELSOL (registered trade mark of Farbenfabriken Bayer A. G., Leverkusen West-Germany). A suitable amount of colloidal silica corresponds with a coverage of 0.1 to 2 g/m$^2$.

A reduced gloss can be obtained by replacing the gelatin in the continuous strippable layer to some extent by hydrophilic polymers that are miscible therewith to some degree and give a somewhat hazy or cloudy aspect to the combination. Examples of such polymers are watersoluble cellulose derivatives, e.g. hydroxypropyl cellulose, dextran and polyvinyl alcohol.

For example, the gloss controlling substances other than from gelatin can be used according to the desired effect in a weight ratio range of 1 to 20 to 2 to 1 with respect to the gelatin.

The colour tone of the image on the permanent support can be controlled by incorporating diffusion-resistant or non-diffusible dyes or pigments in the continuous layer, hereby simulating according to one embodiment the somewhat yellowish-brown tone of antique photographs or parchment base documents.

A material according to the present invention suited for carrying out the above defined process includes as temporary support a cellulose triacetate support whereon a continuous wet-strippable layer is present, characterized in that said continuous layer is a non-photosensitive layer containing hardened gelatin, the gelatin being applied at a coverage of at most 20 g/m$^2$ and the hardening of the gelatin corresponding with that degree of hardening resulting from the addition of at least 0.001 g of formaldehyde per gram of gelatin.

The temporary support is optionally provided with a subbing layer for said continuous layer such in order to improve the adherence thereto in dry state but facilitating its stripping removed in a wet state.

A preferred subbing layer contains some humectant to improve the swelling of said continuous layer in water at its interface with the temporary support to facilitate the wet stripping of said continuous layer together with said subbing layer by reducing the adherence thereof to said support in a wet state. A suitable humectant is glycerol. In said subbing layer glycerol is applied preferably together with unhardened gelatin.

A particularly useful subbing layer for use on a cellulose triacetate support serving as temporary support in the process according to the present invention is described in Example 1.

The transfer of the continuous layer from its temporary support proceeds preferably onto a permanent support having a hydrophilic adhesion improving layer for a hydrophilic colloid layer, layer system or relief pattern applied thereon and is carried out by pre-wetting with water said layer and the optionally already present hydrophilic colloid layer(s) or pattern(s) representing an image and pressing thereto said continuous layer in dry state, e.g. in the nip of a roller-pair exerting some pressure to the contacting materials, whereupon the temporary support is peeled off manually.

The present process has given very satisfactory results for controlling gloss of an image that is obtained as superposed hydrophilic coloured colloid relief patterns by wash-off processing of coloured imagewise hardened hydrophilic colloid layers.

By means of the process of the present invention one can control the gloss as well as the optical dot area (ODA) in halftone multicolour colloid images.

According to a particularly useful embodiment the production of a multicolour colour adopted to have proof wherefrom the gloss and optical dot area can be controlled by the process of the present invention comprises the following steps:

(1) transferring a substantially non-hardened gelatin silver halide emulsion layer containing coloured pigment particles dispersed therein from a temporary support onto a permanent support constituted by paper base support which support may carry already therein a halftone relief image containing coloured hardened gelatin.

(2) imagewise exposing the non-hardened gelatin silver halide emulsion layer either before or after carrying out said step (1), (3) forming by hardening development a halftone image in said transferred silver halide emulsion layer, (4) removing selectively the unhardened regions of the thus developed transferred layer by wash-off processing to leave the hardened regions, and (5) repeating steps (1), (2) and (3) to form at least partly superposed regions of differently coloured gelatin containing layers.

More details about such a process wherein for the formation of a multicolour proof use is made of hardening developed silver halide emulsion layers can be found in U.S. Pat. Nos. 4,701,401 and 4,710,444.

The paper base support may be composed of poly-Alpha-olefin coated paper to reduce the take up of moisture and to speed up the drying.

Figure 1:
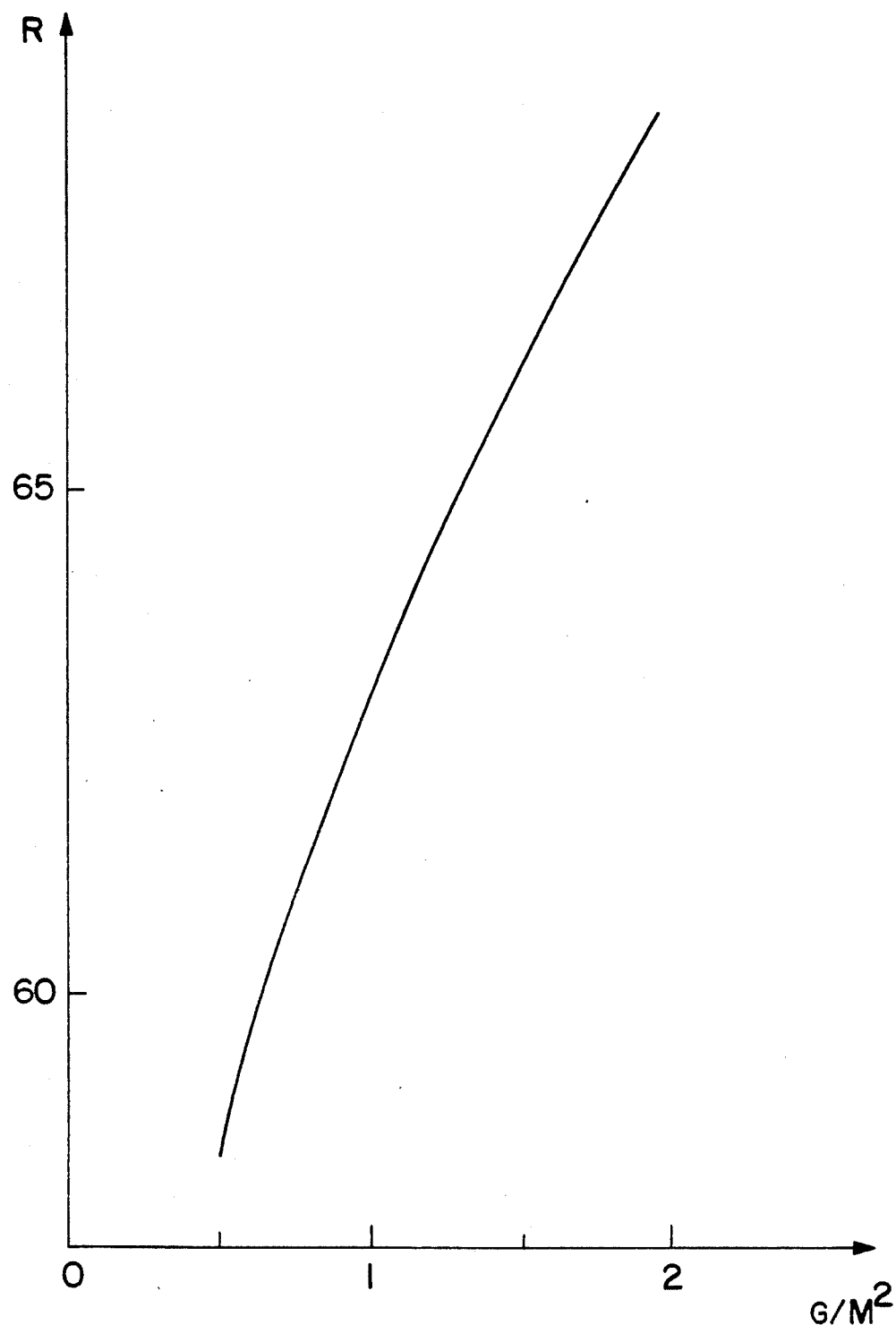
FIG. 1 illustrates the increasing reflectance (R) as an function of the coverage (g/m$^2$) of hydroxypropyl cellulose in combination with gelatin.

In the accompanying FIG. 1 a graph illustrates the increasing reflectance (R) measured according to DIN standard No. 67 530 (November 1972) (measuring angle 60°) as a function of the coverage (g/m$^2$) of colloidal silica in combination with 5 gram of gelatin per m$^2$.

Figure 2:
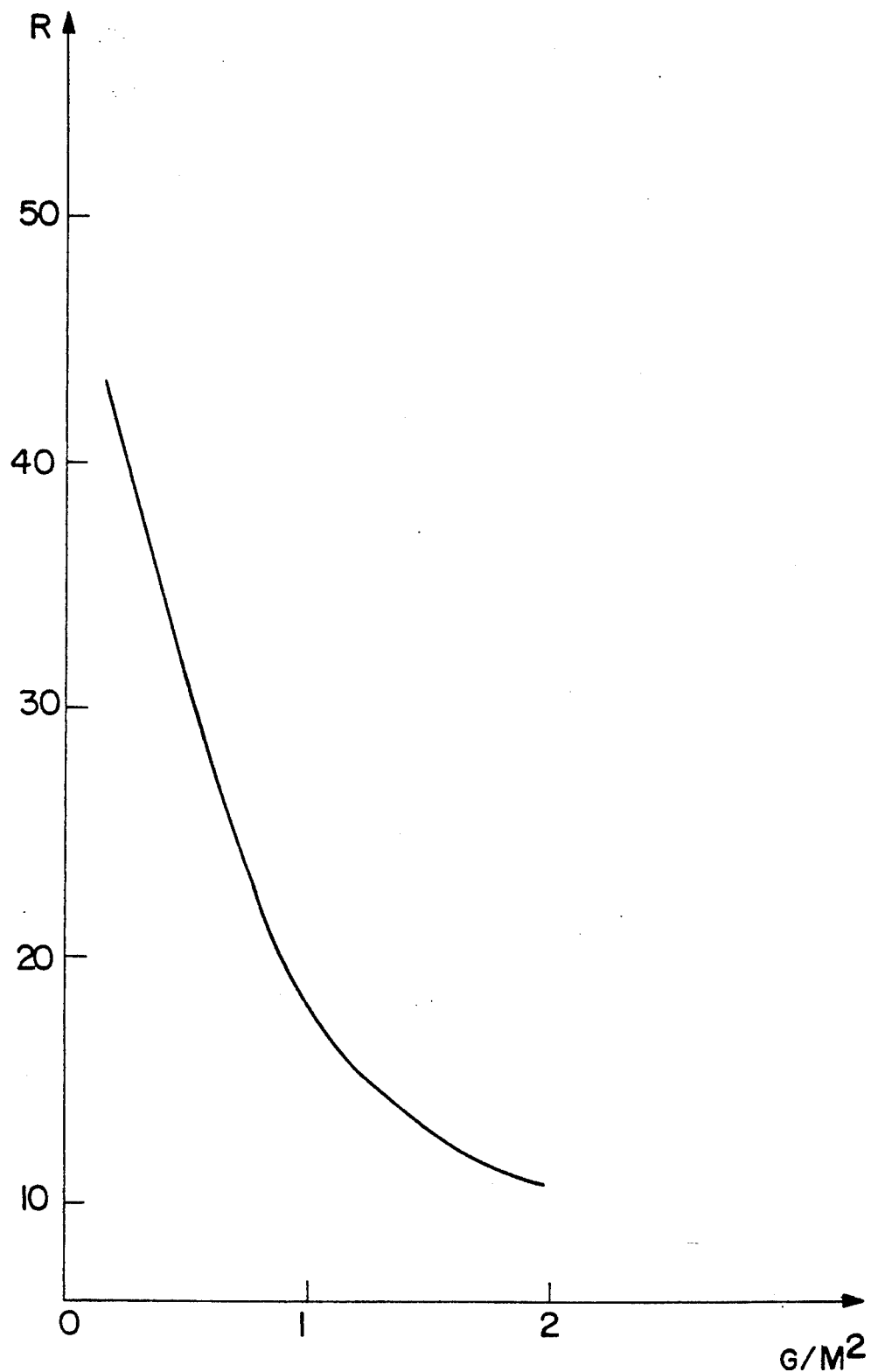
FIG. 2 illustrates the decreasing reflectance (R) as a function of the coverage (g/m$^2$) of hydroxypropyl cellulose in combination with gelatin.

In the accompanying FIG. 2 a graph illustrates the decreasing reflectance (R) measured according to DIN standard No. 67 530 (November 1972) as a function of the coverage (g/m$^2$) of hydroxypropyl cellulose (having a substitution degree DS of hydroxypropyl groups of 3) in combination with 1 gram of gelatin per m$^2$.

Figure 3:
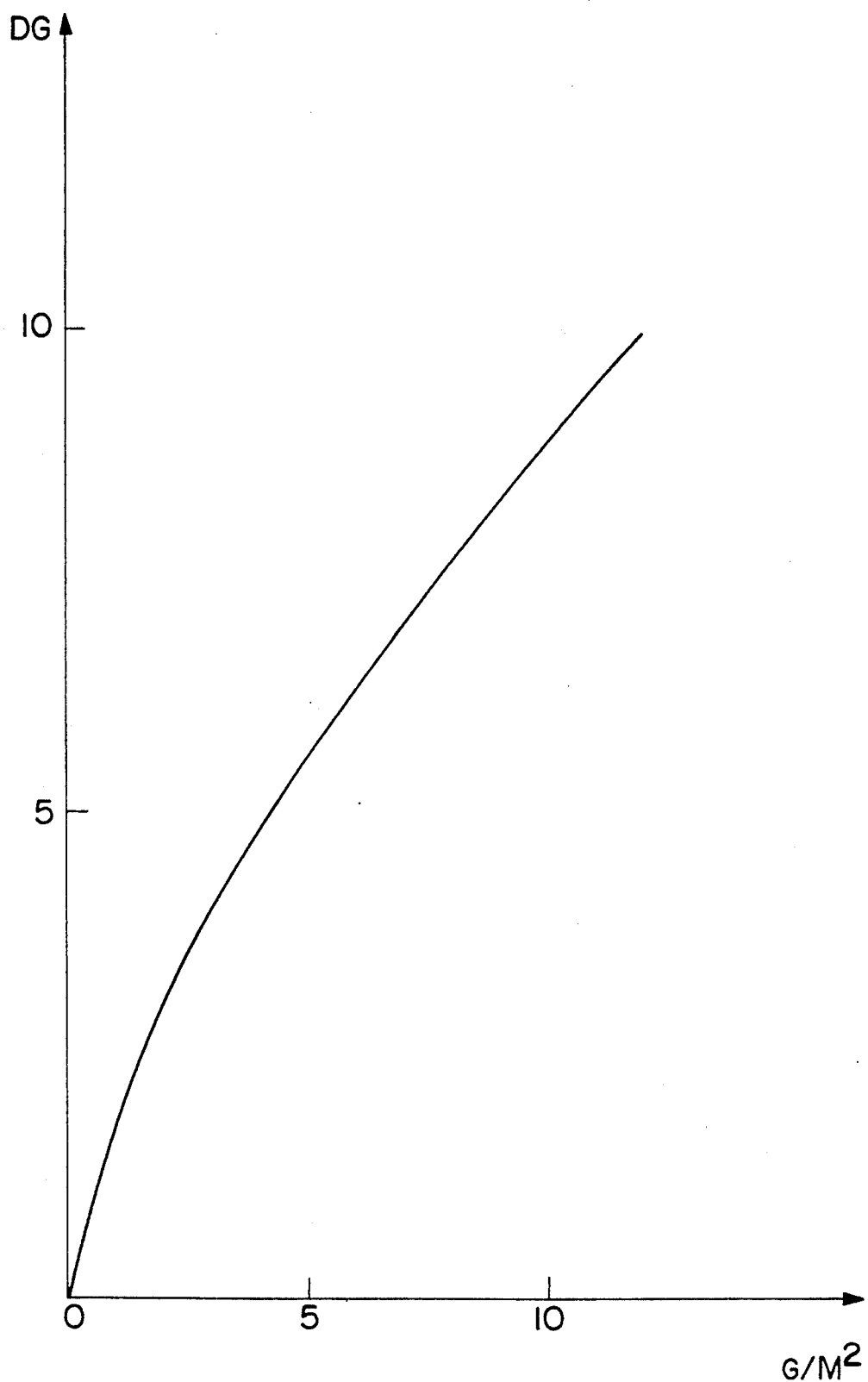
FIG. 3 illustrates the increase in dot gain ($\Delta$ DG) as a function of the coverage (g/m$^2$) of gelatin.

In the accompanying FIG. 3 a graph illustrates the increase in dot gain ($\Delta$ DG) as a function of the coverage (g/m$^2$) of gelatin per m$^2$. The dot gain was measured at 50 percent dot value at 150 lines per 2.54 cm (inch). Details about the determination of dot gain are given at the end of Example 1.

The production of multicolour images by wash-off processing and the control of their gloss and dot gain according to the present invention is illustrated in more detail in the following examples. The percentages and ratios are by weight if not otherwise indicated.

EXAMPLE 1

Preparation of photographic materials on temporary support

On a temporary support of unsubbed cellulose triacetate provided at the rear side with a black anti-halation layer and having a thickness of 0.1 mm, the following layers were applied in the order given:

(i) a silver chlorobromide-iodide emulsion (molar ratio 83.6/16/0.4) containing diffusion-resistant cyan coloured pigment and having a silver halide coverage equivalent with 0.25 g of silver per sq.m. and gelatin coverage of 1.8 g per sq.m. The emulsion was spectrally sensitized for argon ion laser light. The cyan pigment was FLEXONYL BLUE Paste (C.I. Index Nr. 74,160) which was applied at 6.3 g per liter of coating composition corresponding with 0.126 g of pigment solid per m$^2$. The pH of the coating composition was 5.0; and (ii) a non pigmented gelatin binder layer containing per sq.m 0.7 g of gelatin, 0.066 g of hydroquinone and 0.095 g of matting agent on the basis of silica particles coated with urea formaldehyde resin.

In an analogous way other photographic materials with temporary support but containing magenta, yellow and black pigment coatings were prepared.

The magenta pigment coating was prepared starting with a paste sold under the name HELIOECHTCARMIN BB TEIG (Colour Index Nr. 12,485) and the yellow pigment caoting was prepared starting with a paste sold under the name HELIOECHTGELB GRN 7476 Feinteig (Colour Index Nr. 21,100). Said pigment-pastes were used in an amount of 14.5 g and 17.6 g respectively per liter of coating composition. In the black pigment coating a carbon black paste was incorporated in admixture with the above mentioned FLEXONYL BLUE-paste in an amount of 15.75 g and 1.26 g respectively per liter of coating composition.

Preparation of the permanent support

A double-side polyethylene coated paper with paper weight of 180 g/m$^2$ and a polyethylene layer weight of 30 g per m$^2$ was air-knife coated at a wet coverage of 55 g per m$^2$ with the following coating composition:
distilled water: 300 ml.
gelatin: 19.8 g.
20% aqueous latex of copoly(methylmethacrylate-butadiene) (50/50): 151 g. aqueous dispersion containing 2.86% of polymethylmethacrylate and 9.5% of gelatin: 25.5 g.
21.4% aqueous dispersion of TiO$_2$ (average grain size 300 nm) containing 5.7% of gelatin: 131 g.
matting agent A: 5.8 g.
matting agent B: 2.8 g.
wetting agents of the anionic sulphonated type: 2.8 g.
as hardening agent a 20% aqueous solution of formaldehyde: 2.2 ml.
distilled water up to: 1000 ml.

Matting agent A is an aqueous dispersion containing 10.7% of amorphous silica, 6.4% of gelatin and 4.3% of polyethylacrylate latex particles.

Matting agent B is an aqueous dispersion containing 41.8% of Alpha-quartz and 4.2% of gelatin.

The weight % of TiO$_2$ with respect to the total layer composition was 29.5 in the dried layer. The coverage of TiO$_2$ was 1.54 g/m$^2$.

Exposure

The photographic layers on their temporary support were scanningwise halftone exposed on a commercial argon ion laser scanner operating with electronic dot generation.

The four photographic materials containing the differently pigmented coatings, having DIN A4 format, were exposed successsively for obtaining the corresponding colour selections.

Transfer

In the exposed state first the cyan pigment-containing multilayer structure was transferred onto the permanent support as described hereinbefore by soaking the permanent support in water for 30 s and then pressing it into contact with the exterior layer (ii). By stripping apart the temporary support the composite layer structure of layers (i) and (ii) was left on the permanent support and the transferred composite layer was dried.

Hardening development

The transferred composite coating was hardening developed by dipping it for 30 s in an aqueous liquid, called activator bath, having following composition:
potassium hydroxide: 25 g.
potassium carbonate: 150 g.
potassium bromide: 0.5 g.
sodium sulphite: 2.0 g.
4(hydroxymethyl)4-methyl-1-phenyl-3-pyrazolidinone: 5.0 g.
mono sodium salt of ethylenediaminetetra-acetic acid: 1.0 g.

Bleach-fixing

The developed material was led through a bleach-fix bath containing sodium thiosulphate and the mono sodium, iron(III) salt of ethylenediamine tetra-acetic acid.

Wash-off processing

To obtain a cyan coloured relief image the hardening developed and bleach-fix processed material was wash-off processed with a warm (40° C.) water spray. The relief image was dried.

For obtaining a multi-colour relief image the described magenta, yellow and black pigment coatings were exposed and processed analogously to form superposed relief paterns on the same permanent support already containing the cyan image.

Preparation of the temporary support carrying a strippable gloss improving gelatin layer A cellulose triacetate support having a thickness of 0.1 mm was coated with an aqueous subbing composition to obtain a subbing layer containing following ingredients at the defined coverage in g/m²:
gelatin: 0.2 g/m².
Alpha-quartz as matting agent: 0.02 g/m².
glycerol: 0.02 g/m².
saponine: 0.012 g/m².
iso-tetradecyl sulphonic acid sodium salt: 0.013 g/m².

To the dried subbed layer a 7% aqueous gelatin solution incorporating 0.005 g of formaldehyde per gram of gelatin was applied to obtain after drying a hardened gelatin layer serving as gloss-improving strippable layer having a coverage of 10 g of gelatin per m².

Transfer of the gloss improving layer

In a first embodiment, called embodiment A, the gloss improving layer was applied by wet lamination and stripping onto the above defined permanent support before forming any relief pattern thereon.

In a second embodiment, called embodiment B, the gloss improving layer was applied by wet lamination and stripping after the above defined superposed relief patterns (cyan, magenta, yellow and black) were formed.

The reflectance in the white portions of the image was measured according to DIN standard No. 67 530 (November 1972) (measuring angle 60°).

The reflectance measurement values obtained for embodiments A and B were respectively 59.9 and 53.8. The permanent support without the gloss improving layer had a reflectance value of only 36.7.

The increase in dot gain was determined in the materials of embodiment A and B and proved to correspond in both cases to the value 9, which is actually a percentage increase value. The dot gain was measured with respect to the dots in the halftone original at 50% dot value.

The halftone dot area percentage was calculated with the Murray-Davies equation (ref. Murray A., "Monochrome Reproduction in Photoengraving", J. Franklin Institute, vol. 221, p. 721-744, reading as follows:

$$a = \frac{1 - 10^{-D_t}}{1 - 10^{-D_s}} \times 100$$

wherein:
$D_t$ represents the density of the halftone tint,
$D_s$ represents the density of the solid, and
$a$ represents the halftone dot area percentage.

The dot gain is obtained by subtracting the dot area percentage of the original halftone separation image from the above calculated one obtained on the colour proof material provided with gloss improving layer according to embodiment A or B.

EXAMPLES 2 TO 22

Example 1 along the lines of embodiment B was repeated but with gloss and dot gain controlling coatings having a gelatin coverage and coverage of another ingredient as defined in the following table wherein also the values of reflectance and of increase in dot gain (Δ DG) obtained therewith are given.

TABLE

| Gelatin | Ingredient | g/m2 | Reflectance value | Δ DG |
|---|---|---|---|---|
| 2.5 | PVP | 0.5 | 47.2 | 4 |
| 2.0 | PVP | 1.0 | 49.1 | 3 |
| 1.5 | PVP | 1.5 | 39.1 | 3 |
| 3.0 | — | — | 51.2 | 4.5 |
| 4.0 | PVP | 1.0 | 53.6 | 5 |
| 4.0 | DEX | 1.0 | 52.6 | 5 |
| 4.0 | PVA | 1.0 | 39.1 | 5 |
| 4.0 | HPC | 1.0 | 24.7 | 5 |
| 2.5 | HPC | 0.5 | 43.3 | 5 |
| 2.0 | HPC | 1.0 | 32.6 | 5 |
| 1.5 | HPC | 1.5 | 17.9 | 5 |
| 1.0 | HPC | 2.0 | 10.6 | 3 |
| 2.75 | — | — | 50.5 | 4 |
| 4.50 | — | — | 55.7 | 5 |
| 6.80 | — | — | 62.1 | 7 |
| 9.00 | — | — | 69.6 | 8 |
| 12.0 | — | — | 78.5 | 10 |
| 6.5 | SiO₂ | 0.3 | 64.2 | 6 |
| 6.1 | SiO₂ | 0.6 | 65.9 | 6.5 |
| 5.6 | SiO₂ | 1.1 | 65.3 | 7 |
| 4.8 | SiO₂ | 1.9 | 70.3 | 6 |

PVP: poly-N-vinylpyrrolidone (average molecular weight: 10,000).
DEX: dextran (C₆H₁₀O₅)ₓ (average molecular weight: 70,000).
PVA: polyvinyl alcohol (average molecular weight: 50,000).
HPC: hydroxypropyl celluloe having a DS of 3.
SiO₂: colloidal silica having an average particle size of 10 nm.

We claim:

1. A sheet material comprising a cellulose triacetate temporary support carrying a continuous wet-strippable layer in direct contact therewith, wherein said continuous layer is a non-photosensitive layer containing hardened gelatin, the gelatin being applied at a coverage of at most 20 g/m² and the hardening of the gelatin corresponding with a hardening resulting from the addition of at least 0.001 g of formaldehyde per gram of gelatin.

2. A material according to claim 1, wherein said continuous layer contains diffusion-resistant dyes or pigments.

3. A material according to claim 1, wherein said continuous layer contains a member selected from the group consisting of poly-N-vinylpyrrolidone and colloidal silica for improving the gloss.

4. A material according to claim 1, wherein said continuous layer contains a member selected from the group consisting of dextran, hydroxypropyl cellulose and polyvinyl alcohol for reducing the gloss.

5. A material according to claim 1, wherein said continuous layer contains also a gloss controlling substance different from gelatin.

6. A material according to claim 5, wherein said continuous layer contains said gloss controlling substance different from gelatin in a weight ratio range of 1 to 20 to 2 to 1 with respect to gelatin.

7. A sheet material comprising a cellulose triacetate temporary support; a hydrophilic subbing layer containing an humectant in contact with said temporary support; and on the side of said subbing layer opposite said temporary support, a continuous wet-strippable layer, wherein said continuous layer is a non-photosensitive layer containing hardened gelatin, the gelatin being applied at a coverage of at most 20 g/m$^2$ and the hardening of the gelatin corresponding with a hardening resulting from the addition of at least 0.001 g of formaldehyde per gram of gelatin.

8. A material according to claim 7, wherein the humectant is glycerol.

* * * * *